United States Patent
Hu et al.

(10) Patent No.: US 9,287,308 B2
(45) Date of Patent: Mar. 15, 2016

(54) IMAGE SENSOR HAVING METAL CONTACT COUPLED THROUGH A CONTACT ETCH STOP LAYER WITH AN ISOLATION REGION

(71) Applicant: OMNIVISION TECHNOLOGIES, INC., Santa Clara, CA (US)

(72) Inventors: Sing-Chung Hu, San Jose, CA (US); Dajiang Yang, San Jose, CA (US); Oray Orkun Cellek, Mountain View, CA (US); Hsin-Chih Tai, San Jose, CA (US); Gang Chen, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 13/858,754

(22) Filed: Apr. 8, 2013

(65) Prior Publication Data

US 2014/0299957 A1 Oct. 9, 2014

(51) Int. Cl.
*H01L 31/062* (2012.01)
*H01L 27/146* (2006.01)

(52) U.S. Cl.
CPC ...... *H01L 27/1463* (2013.01); *H01L 27/14636* (2013.01); *H01L 27/14643* (2013.01)

(58) Field of Classification Search
CPC .............. H01L 27/14636; H01L 27/14627; H01L 27/14621; H01L 27/14632; H01L 27/14625; H01L 27/14685; H01L 27/14687; H01L 27/14634; H01L 27/14645; H01L 27/14689; H01L 27/14609; H01L 27/14629; H01L 27/14603; H01L 27/14641

USPC .............. 438/70, 65, 72, 73, 48, 69, 29, 458, 438/510, 59, 7, 98; 250/208.1, 214.1, 226; 348/294, 308; 358/482, 513

See application file for complete search history.

(56) References Cited

U.S. PATENT DOCUMENTS

| 4,966,870 A | 10/1990 | Barber et al. |
| 5,840,624 A | 11/1998 | Jang et al. |

(Continued)

FOREIGN PATENT DOCUMENTS

| JP | 2006-261355 A | 9/2006 |
| JP | 2011-243747 A | 12/2011 |
| TW | 201010071 A | 3/2010 |

OTHER PUBLICATIONS

Cacciato et al., "Borderless Nitride Requirements for Embedded Non-Volatile Deep Sub-Micron Technologies," Philips Semiconductors, Nijmegen, The Netherlands, IEEE, 2003, pp. 485-488.

(Continued)

*Primary Examiner* — Su C Kim
*Assistant Examiner* — Junaiden Mirsalahuddin
(74) *Attorney, Agent, or Firm* — Blakely Sokoloff Taylor & Zafman LLP

(57) ABSTRACT

An image sensor pixel includes one or more photodiodes disposed in a semiconductor layer. Pixel circuitry is disposed in the semiconductor layer coupled to the one or more photodiodes. A passivation layer is disposed proximate to the semiconductor layer over the pixel circuitry and the one or more photodiodes. A contact etch stop layer is disposed over the passivation layer. One or more metal contacts are coupled to the pixel circuitry through the contact etch stop layer. One or more isolation regions are defined in the contact etch stop layer that isolate contact etch stop layer material through which the one or more metal contacts are coupled are coupled to the pixel circuitry from the one or more photodiodes.

21 Claims, 3 Drawing Sheets

(56) References Cited

U.S. PATENT DOCUMENTS

| | | | |
|---|---|---|---|
| 6,083,824 | A | 7/2000 | Tsai et al. |
| 8,076,170 | B2 | 12/2011 | Brady |
| 2006/0163628 | A1 | 7/2006 | Mori et al. |
| 2006/0183265 | A1 | 8/2006 | Oh et al. |
| 2006/0199295 | A1 | 9/2006 | Hong et al. |
| 2006/0208289 | A1 | 9/2006 | Ohkawa et al. |
| 2007/0048965 | A1 | 3/2007 | Hsieh et al. |
| 2008/0017945 | A1 | 1/2008 | Wu et al. |
| 2010/0006969 | A1* | 1/2010 | Park et al. .................. 257/446 |
| 2010/0285630 | A1* | 11/2010 | Lee .............................. 438/70 |
| 2011/0285892 | A1 | 11/2011 | Itahashi |
| 2012/0261730 | A1 | 10/2012 | Chen et al. |

OTHER PUBLICATIONS

Lachenal et al., "Reliability Investigation of NLDEMOS in 0.13μm SOI CMOS Technology," Proc. 25$^{th}$ International Conference on Microelectronics, Belgrade, Serbia and Montenegro, IEEE, May 2006 (4 pages).

Mora et al., "Reliability Issues Related to Fast Charge Loss Mechanism in Embedded Non Volatile Memories," STMicroelectronics, Crolles Cedex, France, IEEE, IIRW Final Report, 2006, pp. 68-72.

Beylier et al., "Refined Electrical Analysis of Two Charge States Transition Characteristic of "Borderless" Silicon Nitride," STMicroelectronics, Crolles, France, Microelectronics Reliability 47, pp. 743-747.

Chen et al., U.S. Appl. No. 13/462,545, filed May 2, 2012, titled "Image Sensor With Segmented Etch Stop Layer".

EP Patent Application No. 14163622.5—Extended European Search Report, mailed Nov. 22, 2014 (7 pages).

EP Patent Application No. 14163622.5—Extended European Search Report, mailed Oct. 22, 2014 (7 pages).

KR Patent Application No. 10-2014-0041094—Korean Office Action, Mailed Sep. 9, 2015, with English Translation (6 pages).

KR Patent Application No. 10-2014-0041094—Korean Office Action and Search Report, Mailed May 11, 2015, with English Translation (15 pages).

JP Patent Application No. 2014-078462—Japanese Office Action and Search Report, issued Mar. 2, 2015, with English Translation (6 pages).

JP Patent Application No. 2014-078462—Japanese Office Action, issued Jan. 6, 2016, with English Translation (8 pages).

* cited by examiner

IMAGE SENSOR HAVING METAL CONTACT COUPLED THROUGH A CONTACT ETCH STOP LAYER WITH AN ISOLATION REGION

BACKGROUND INFORMATION

1. Field of the Disclosure

The present invention relates generally to imaging. More specifically, examples of the present invention are related to complementary metal oxide semiconductor based image sensors.

2. Background

The electrical signature of an image with high brightness levels that falls onto a complementary metal oxide semiconductor (CMOS) image sensor may remain embedded in subsequently read out electrical signatures of subsequently acquired images. The electrical signature of a previously sensed image remaining in the image sensor has been called a "ghost artifact" or a "memory effect." This unwanted effect can be exacerbated by repeated exposure of static images, especially high intensity or bright images, to the image sensor. The retention of ghost images represents noise that obscures subsequently acquired images and reduces the signal to noise ratio and may cause blur if there is movement being imaged.

The memory effect problem has been found to be especially present in CMOS image sensors that have been fabricated using advanced fabrication technologies, particularly those employing measures to maximize metal interconnect density. For instance, those fabrication technologies employing so-called "borderless contacts" have been found to be associated with the root cause of this problem.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
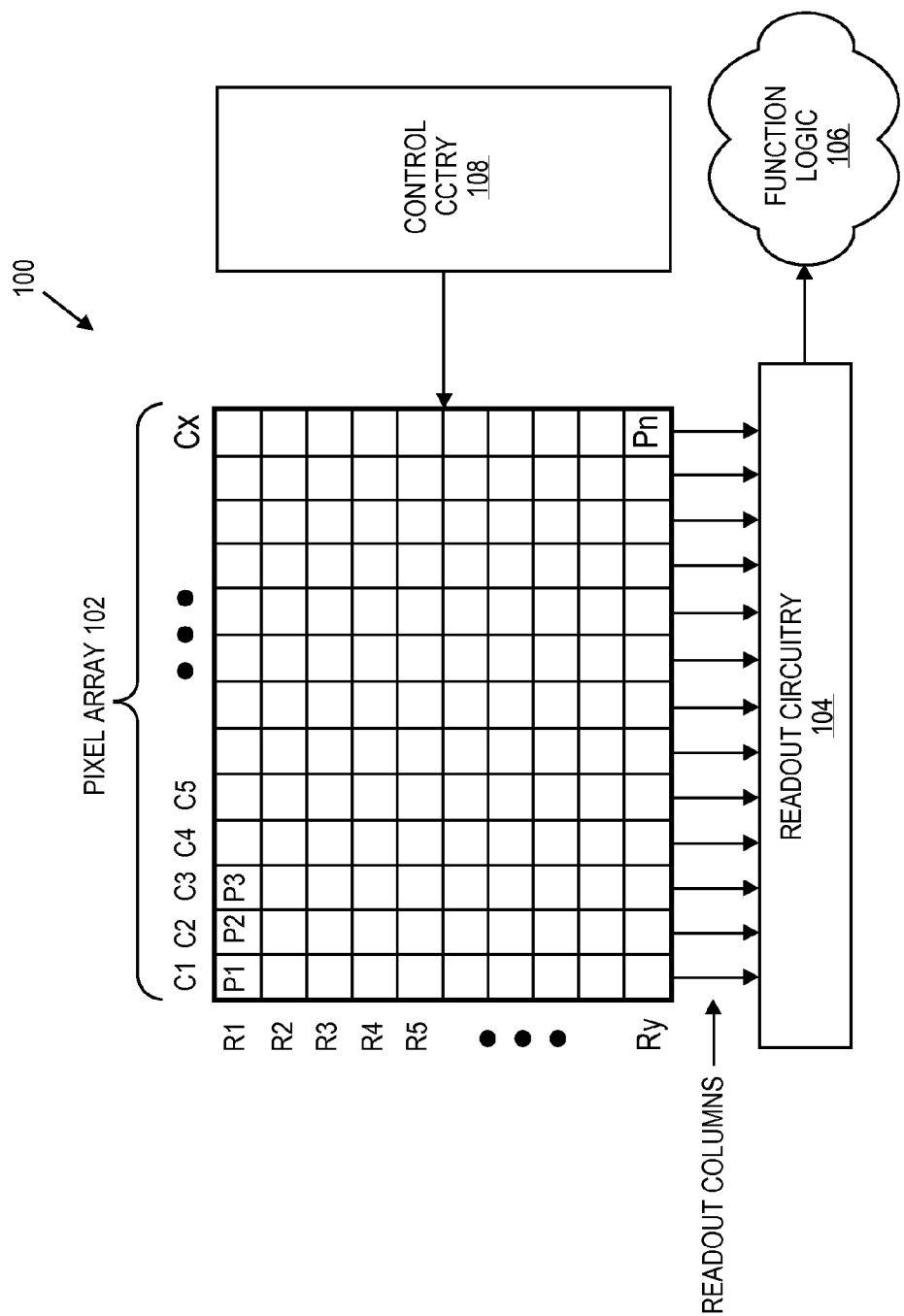
FIG. 1 is a diagram illustrating one example of an imaging system including an example pixel array with image sensor pixels with metal contacts coupled to pixel circuitry through a contact etch stop layer having isolation regions in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

Examples in accordance with the teaching of the present address a contributing factor among the root causes for memory effect in complementary metal oxide semiconductor (CMOS) image sensors and provide solutions to reduce or eliminate memory effect in CMOS image sensors that include etch stop layers. Example CMOS image sensors in accordance with the teachings of the present invention include an example contact etch stop layer, which makes possible borderless contact elements in CMOS image sensor with reduced or no memory effect. Specifically, instead of providing a continuous contact etch stopping layer over the entire surface of an image sensor, except where a metal contact is coupled through the contact etch stop layer to pixel circuitry, example image sensors in accordance with the teachings of the present include image sensors pixels that include a contact etch stop layer with isolation regions. For instance, in one example, the image sensor pixels include one or more photodiodes disposed in a semiconductor layer. Pixel circuitry is disposed in the semiconductor layer coupled to the one or more photodiodes. A passivation layer is disposed proximate to the semiconductor layer over the pixel circuitry and the one or more photodiodes. A contact etch stop layer is disposed over the passivation layer. One or more metal contacts are coupled to the pixel circuitry through the contact etch stop layer. One or more isolation regions are defined in the contact etch stop layer that isolate the metal contacts, and the contact etch stop layer material through which the one or more metal contacts are coupled to the pixel circuitry, from the one or more photodiodes. By isolating the metal contacts, as well as the contact etch stop layer material through which the metal contacts are coupled to pixel circuitry, the stress paths in the contact etch stop layer between the photodiode regions and the metal contacts are substantially eliminated, which reduces memory effect in the image sensor in accordance with the teachings of the present invention.

To illustrate, FIG. 1 is a diagram illustrating one example of an imaging system 100 including an example pixel array 102 having a contact etch stop layer with isolation regions in accordance with the teachings of the present invention. As shown in the depicted example, imaging system 100 includes pixel array 102 coupled to control circuitry 108 and readout circuitry 104, which is coupled to function logic 106.

In one example, pixel array 102 is a two-dimensional (2D) array of imaging sensors or pixels (e.g., pixels P1, P2 . . . Pn). In one example, each pixel is a CMOS imaging pixel. As illustrated, each pixel is arranged into a row (e.g., rows R1 to Ry) and a column (e.g., column C1 to Cx) to acquire image data of a person, place, object, etc., which can then be used to render a 2D image of the person, place, object, etc.

In one example, after each pixel has acquired its image data or image charge, the image data is readout by readout circuitry 104 and then transferred to function logic 106. In various examples, readout circuitry 104 may include amplification circuitry, analog-to-digital (ADC) conversion circuitry, or otherwise. Function logic 106 may simply store the image data or even manipulate the image data by applying post image effects (e.g., crop, rotate, remove red eye, adjust brightness, adjust contrast, or otherwise). In one example, readout circuitry 104 may readout a row of image data at a time along readout column lines (illustrated) or may readout the image data using a variety of other techniques (not illustrated), such as a serial readout or a full parallel readout of all pixels simultaneously.

In one example, control circuitry 108 is coupled to pixel array 102 to control operational characteristics of pixel array 102. For example, control circuitry 108 may generate a shutter signal for controlling image acquisition. In one example, the shutter signal is a global shutter signal for simultaneously enabling all pixels within pixel array 102 to simultaneously capture their respective image data during a single acquisition window. In another example, the shutter signal is a rolling shutter signal such that each row, column, or group of pixels is sequentially enabled during consecutive acquisition windows.

Figure 2A:
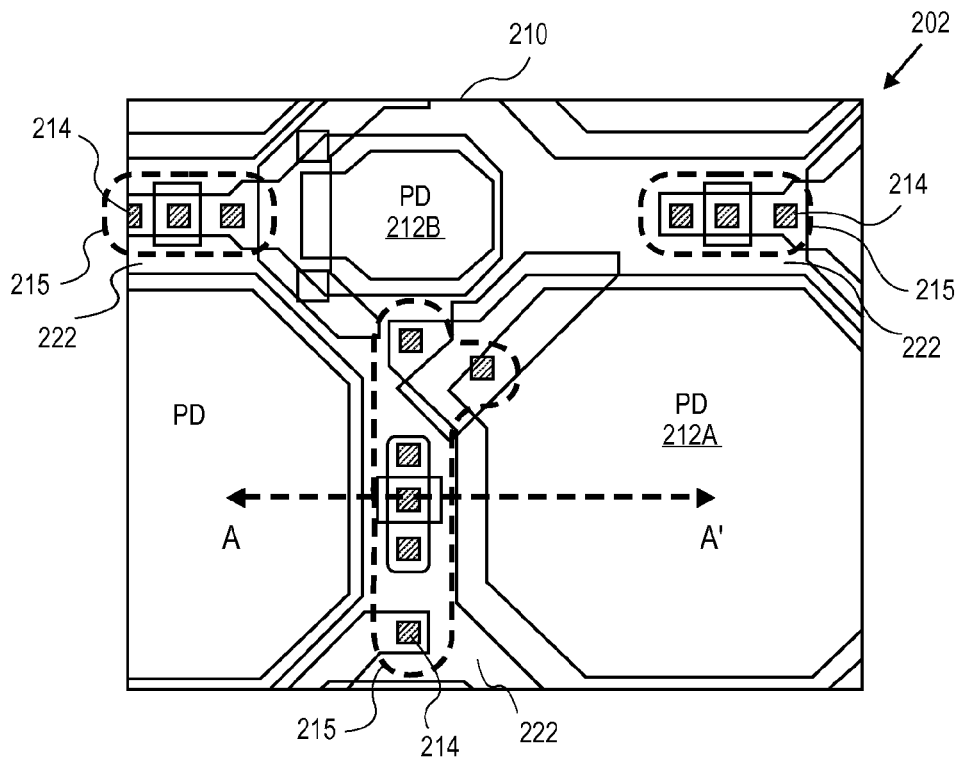
FIG. 2A illustrates a top down view of one example of a pixel array with image sensor pixels having metal contacts coupled to pixel circuitry through a contact etch stop layer.

FIG. 2A illustrates a top down view of one example of a semiconductor substrate 210 of an example pixel array 202 of image sensor pixels. It is appreciated that in one example, pixel array 202 is an illustration that provides increased detail of one example of pixel array 102 of FIG. 1. As shown in the example depicted in FIG. 2A, pixel array 202 includes an array of image sensor pixels, which include a plurality of photodiodes (PD) and metal contacts 214, which are coupled through a contact etch stop layer 222 to pixel circuitry associated with the photodiodes arranged in semiconductor layer 210. In various examples, each pixel may include one or more photodiodes (e.g., 212A and/or 212B) and one or more metal contacts 214. In the example depicted in FIG. 2A, one of the image sensor pixels includes a photodiode 212A and a photodiode 212B, as well as one or more metal contacts 214, which are coupled to associated pixel circuitry in semiconductor substrate 210. In another example, it is appreciated that the image sensor pixel may include only one photodiode. In one example, metal contacts 214 are coupled to pixel circuitry that may include pixel circuit elements such as for example, but not limited to, a transfer transistor, a floating diffusion, or the like. In one example, one or more image sensor pixels may also include or share a charge to a voltage converting floating diode and an amplifier transistor.

As will be discussed in further detail below, in one example, a contact etch stop layer 222 is deposited over a passivation layer that is deposited over pixel array 202. The deposition of a contact etch stop layer 222 is a fabrication technique that may be utilized when providing borderless contacts, which may be employed to increase metal interconnect density in pixel array 202. In one example, isolation regions are defined in the contact etch stop layer 222 which substantially eliminate stress paths in the contact etch stop layer 222 between the photodiode regions and the metal contacts, as well as to the contact etch stop layer 222 material through which the metal contacts are coupled in accordance with the teachings of the present invention.

Figure 2B:
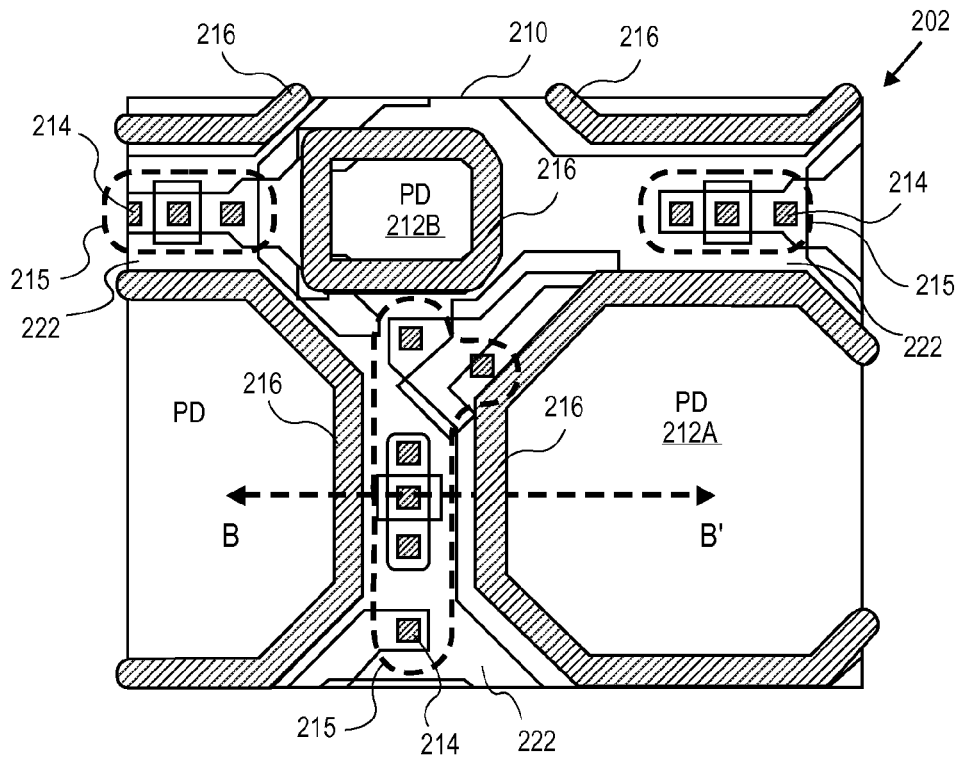
FIG. 2B illustrates a top down view of one example of a pixel array with image sensor pixels having metal contacts coupled to pixel circuitry through a contact etch stop layer having isolation regions in accordance with the teachings of the present invention.

To illustrate, FIG. 2B illustrates a top down view of one example of a pixel array 202 with image sensor pixels having metal contacts 214 coupled through a contact etch stop layer 222 with isolation regions 216 in accordance with the teachings of the present invention. It is appreciated that pixel array 202 of FIG. 2B shares similarities with pixel array 202 of FIG. 2A and that similarly named and numbered elements referenced below are coupled and function as described above. As shown in the example and will be discussed in further detail below, isolation regions 216 as illustrated for example in FIG. 2B are defined in the contact etch stop layer 222 of the image sensor pixels of pixel array 202, which isolate the metal contacts 214, as well as the contact etch stop layer 222 material through which the metal contacts 214 are coupled to associated pixel circuitry, from the photodiodes including photodiode 212A and photodiode 212B in accordance with the teachings of the present invention. In particular, stress paths in the contact etch stop layer 222 between the photodiodes 212A and 212B and metal contacts 214 are substantially eliminated with isolation regions 216 in accordance with the teachings of the present invention. It is appreciated that by changing the structure of pixel array 202 by defining isolation regions 216 in the contact etch stop layer 222 as shown, additional electrical and/or mechanical effects on the pixels are realized, which reduces ghost artifacts or memory effects in pixel array 202 in accordance with the teachings of the present invention.

Figure 3A:
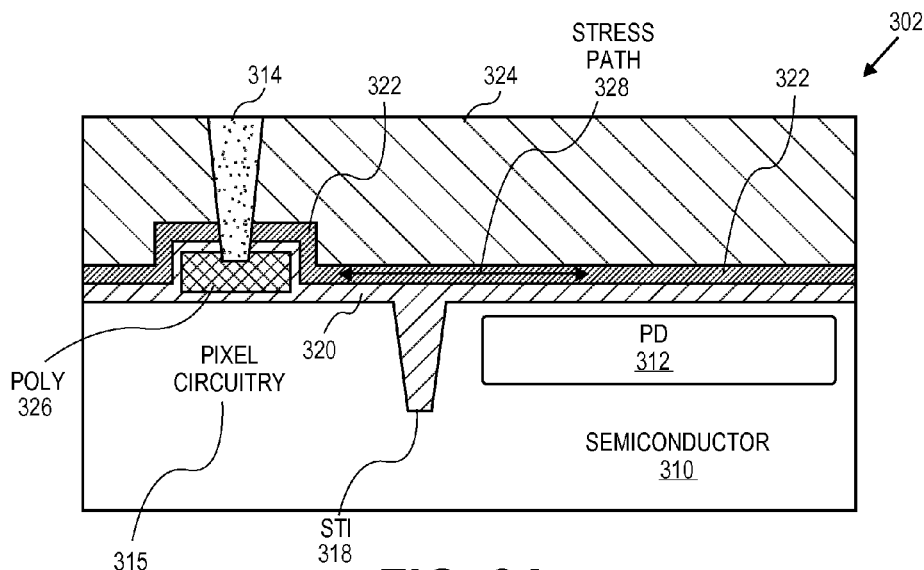
FIG. 3A illustrates a cross-section view of one example of a semiconductor substrate layer included in an example pixel array with image sensor pixels having metal contacts coupled to pixel circuitry through a contact etch stop layer.

To illustrate, FIG. 3A shows a cross-section view of one example of a semiconductor substrate layer 310 included in an example pixel array 302 of a CMOS image sensor in accordance with the teachings of the present invention. It is noted that in one example, pixel array 302 of FIG. 3A is a cross-section view along line A-A' of pixel array 202 of FIG. 2A. As shown in the depicted example, pixel array 302 includes a semiconductor substrate layer 310, including for example silicon, with a photodiode 312 region disposed therein. In the example, photodiode 312 region may be the only or one of a plurality of photodiode regions disposed in semiconductor 310 that are included in an image sensor pixel of pixel array 302. As shown in the depicted example, there is a shallow trench isolation (STI) 318 region disposed in semiconductor substrate layer 310, which separates photodiode 312 region from neighboring pixel circuitry 315 in the semiconductor substrate layer 310.

As shown in the depicted example, a passivation layer 320 is deposited proximate to semiconductor substrate layer 310 over pixel circuitry 315 and photodiode 312 of pixel array 302. In one example, passivation layer 320 may include an insulating material such as for example silicon oxide based dielectric layers or the like. In the illustrated example, the pixel circuitry 315 is shown includes a polysilicon region 326, which in one example represents a polysilicon gate structure or the like. It is appreciated of course that pixel circuitry 315 may include other circuit structures such as for example but not limited to a transfer transistor, a floating diffusion, an amplifier transistor, or the like. In the depicted example, polysilicon region 326 is shown as being surrounded with the oxide material of passivation layer 320.

FIG. 3A also illustrates that a contact etch stop layer 322 is disposed over passivation layer 320, which is deposited over pixel circuitry 315 and photodiode 312 of pixel array 302 in semiconductor substrate layer 310. In one example, contact etch stop layer 322 is utilized when providing borderless contacts to be fabricated in pixel array 302. As such, contact etch stop layer 322 is utilized to protect underlying structures from damage during the dry etching process that is used to form contact openings. Accordingly, etch stop layer 322 has a slower etch rate than for example silicon oxide based dielectric layers.

FIG. 3A also illustrates a dielectric layer 324 that is disposed over contact etch stop layer 322, which is deposited over passivation layer 320, which is deposited over semiconductor substrate layer 310 as shown. In one example, dielectric layer 324 is metal interconnect layer 324 that may include an insulating material such as for example borophosphosilicate glass or the like.

FIG. 3A also shows that a metal contact 314 is coupled to pixel circuitry 315 through contact etch stop layer 322. In one example, metal contact 314 is coupled to polysilicon region 326 of pixel circuitry 315 through contact etch stop layer 322 and through dielectric layer 324. In one example, metal contact 314 is one of a plurality of metal contacts 314 included in an example image sensor pixel of pixel array 302.

In the example depicted in FIG. 3A, it is noted that the contact etch stop layer 322 is continuous between the photodiode 312 region to the metal contact 314. As a result, FIG. 3A shows that there is a stress path 328 in contact etch stop layer 322 between the photodiode 312 region and the metal contact 314, as well as between the photodiode 312 region and the contact etch stop layer 322 material through which metal contact 314 is coupled to polysilicon region 326 of the pixel circuitry 315.

In the example depicted in FIG. 3A, it is noted that the contact etch stop layer 322 is continuous between the photodiode 312 region to the metal contact 314. As a result, FIG. 3A shows that there is a stress path 328 in contact etch stop layer 322 between the photodiode 312 region and the metal contact 314, as well as between the photodiode 312 region and the contact etch stop layer 322 material through which metal contact 314 is coupled to polysilicon region 326 of the pixel circuitry 315.

Contact etch stop layer 322 includes a silicon nitride based dielectric including for example silicon oxynitride or silicon carbide or the like. In one example, contact etch stop layer 322 may be deposited using a plasma enhanced chemical vapor deposition (PECVD), which employs an electrically driven plasma to breakdown source gases such as Silane ($SiH_4$), ammonia ($NH_4$) and oxygen ($O_2$) to provide sources of silicon, nitrogen and oxygen for the formation of silicon nitride and/or silicon oxynitride.

In one example, the resulting contact etch stop layer 322 may therefore be characterized by including significant amounts of mobile charge due to residual hydrogen or poorly formed crystallographic bonding between atoms, such as for example Si—Si bonds or Si—H bonds. In one example, the resulting contact etch stop layer 322 is also characterized by having residual mechanical stress associated with the chosen deposition process parameters or the chosen relative quantities of the reacting gases.

The mobile charges in the PECVD silicon nitride and/or silicon oxynitride of contact etch stop layer 322 can be moved by electrical forces such as electrical fields placed across contact etch stop layer 322, which can cause unwanted effects in nearby semiconductor regions, such as photodiode regions 312 and/or the pixel circuitry 315 included in the pixels of pixel array 302. For example, the source to drain resistance of a transistor included in the pixel circuitry 315 included in the pixels of pixel array 302 may be affected by the mobile charge in the overlying PECVD silicon nitride of contact etch stop layer 322 by altering the depletion characteristics of an underlying lightly doped source or drain region. In addition, it is noted that the interface between the PECVD silicon nitride and/or silicon oxynitride of contact etch stop layer 322 and other films, such as silicon dioxide films, are capable of holding charges typically in broken bonds between various atoms at the interfaces.

Furthermore, it is noted that a net positive charge buildup can also be induced in the PECVD silicon nitride and/or silicon oxynitride of contact etch stop layer 322 by exposure to visible light, which can occur when photodiode 312 regions of pixel array 302 are illuminated. In particular, the energy associated with the phonon modes of the Si—Si and Si—H crystal structures may participate in the optical excitation of the electrical carriers. Phonons are a property associated with the crystal structure and therefore likely are tied to the stress property of the PECVD silicon nitride and/or silicon oxynitride of contact etch stop layer 322.

All of above summarized charge-related characteristics of the PECVD silicon nitride and/or silicon oxynitride of contact etch stop layer 322 can cause unwanted effects in semiconductor regions nearby, and thus contribute to unwanted ghost artifacts or memory effects in pixel array 302.

In order to address the unwanted ghost artifacts or memory effects in pixel array 302 that may be caused by contact etch stop layer 322, one or more isolations regions may be defined in the contact etch stop layer 322 to relieve some of the stress by substantially eliminating the stress paths 328 in contact etch stop layer 322 between the photodiode 312 regions to the metal contacts 314 in accordance with the teachings of the present invention.

Figure 3B:
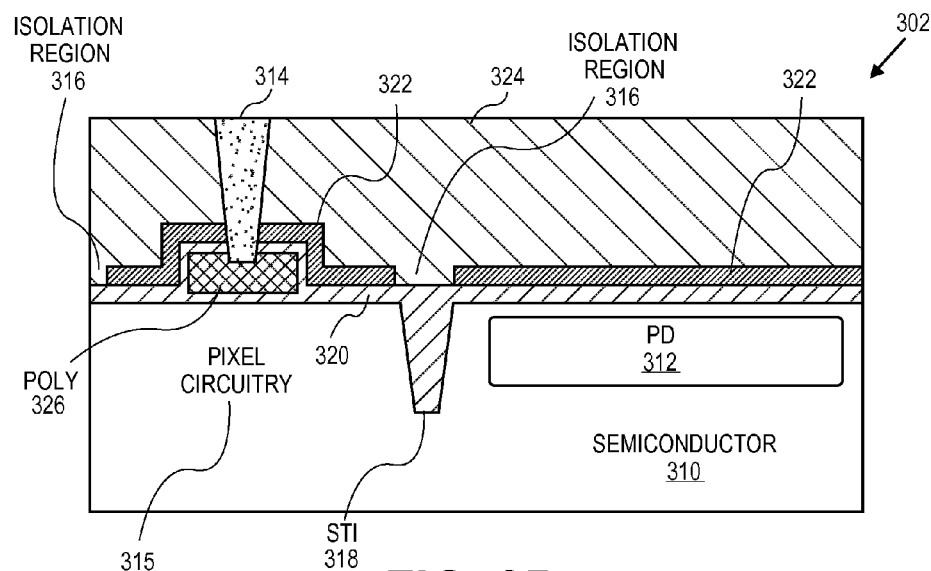
FIG. 3B illustrates a cross-section view of one example of a semiconductor substrate layer included in an example pixel array with image sensor pixels having metal contacts coupled to pixel circuitry through a contact etch stop layer with isolation regions in accordance with the teachings of the present invention.

To illustrate, FIG. 3B illustrates a cross-section view of one example of a semiconductor substrate layer 310 included in an example pixel array 302 with image sensor pixels having metal contacts 314 coupled through a contact etch stop layer 322 with isolation regions 316 in accordance with the teachings of the present invention. It is noted that in one example, pixel array 302 of FIG. 3B is a cross-section view along line B-B' of pixel array 202 of FIG. 2B. It is appreciated that pixel array 302 of FIG. 3B shares similarities with pixel array 302 of FIG. 3A and that similarly named and numbered elements referenced below are coupled and function as described above.

As shown in the example depicted in FIG. 3B, one or more isolation regions 316 are defined in contact etch stop layer 322. As such, the metal contact 314, as well as the surrounding contact etch stop layer 322 material through which the metal contact 314 is coupled to the pixel circuitry 315, is isolated from the neighboring photodiode 312 region. In particular, the one or more isolation regions 316 defined in the contact etch stop layer 322 substantially eliminate stress paths in the contact etch stop layer 322 between the one or more metal contacts 314 from the one or more neighboring photodiode 312 regions of the image sensor pixel of pixel array 302 in accordance with the teachings of the present invention. In one example, the isolation regions 316 are defined in contact etch stop layer 322 by removing or etching away the contact etch stop layer 322 material as shown between metal contacts 314 and photodiode 312 regions as shown to eliminate substantially the stress paths 328 as described previously. In one example, the removal or etching away of contact etch stop layer 322 material relieves at least some of the stress in contact etch stop layer 322 in accordance with the teachings of the present invention.

By removing the contact etch stop layer 322 material and defining the isolation regions 316 in contact etch stop layer 322 as shown, the memory effect is reduced or eliminated in pixel array 302 in accordance with the teachings of the present invention. In particular, the isolation regions 316 defined in contact etch stop layer 322 as shown may reduce the memory effect in pixel array 302 because the stress otherwise present in etch stop layer 322 has been released by the removal of portions 316, which therefore reduces the propensity of etch stop layer 322 to become optically excited and hold ghost artifact images through charge trapping within etch stop layer 322 or at interfaces of etch stop layer 322 with adjacent films, including for example passivation layer 320. In addition, it is noted that the memory effect may also be reduced in pixel array 302 because the trenching performed when removing portions 316 from etch stop layer 322 may result in an overall reduction of mobile charge within etch stop layer 322, which also reduces memory effect in pixel array 302 in accordance with the teachings of the present invention.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

What is claimed is:

1. An image sensor pixel, comprising:
   one or more photodiodes disposed in a semiconductor layer;
   pixel circuitry disposed in the semiconductor layer coupled to the one or more photodiodes;
   a passivation layer disposed proximate to the semiconductor layer over the pixel circuitry and the one or more photodiodes;
   a single contact etch stop layer disposed over the passivation layer, wherein the single contact etch stop layer defines one or more isolation regions, wherein there is an absence of material of the single contact etch stop layer in the one or more isolation regions defined in the single contact etch stop layer;
   one or more metal contacts coupled to the pixel circuitry through a first portion of the single contact etch stop layer, wherein a second portion of the single contact etch stop layer is disposed in a photodiode region of the one or more photodiodes,
   wherein the one or more isolation regions defined in the single contact etch stop layer isolate the first portion of the single contact etch stop layer from the second portion of the single contact etch stop layer.

2. The image sensor pixel of claim 1 wherein the one or more isolation regions defined in the single contact etch stop layer substantially eliminate stress paths in the single contact etch stop layer between the first portion of the single contact etch stop layer and the second portion of the single etch stop layer.

3. The image sensor pixel of claim 1 wherein the one or more isolation regions are defined in the single contact etch stop layer where the material of the single contact etch stop layer is removed between the first portion of the single contact etch stop layer and the second portion of the single etch stop layer.

4. The image sensor pixel of claim 1 wherein the one or more metal contacts comprise borderless contacts.

5. The image sensor pixel of claim 1 wherein the single contact etch stop layer comprises nitride.

6. The image sensor pixel of claim 1 wherein the single contact etch stop layer comprises silicon oxynitride.

7. The image sensor pixel of claim 1 wherein the passivation layer comprises oxide.

8. The image sensor pixel of claim 1 further comprising a dielectric layer disposed over the single contact etch stop layer.

9. The image sensor pixel of claim 8 wherein the dielectric layer comprises borophosphosilicate glass.

10. The image sensor pixel of claim 1 wherein the image sensor pixel is comprised in a complementary metal oxide semiconductor (CMOS) image sensor.

11. An imaging system, comprising:
    a pixel array of image sensor pixels, wherein each one of the image sensor pixels includes:
      one or more photodiodes disposed in a semiconductor layer;
      pixel circuitry disposed in the semiconductor layer coupled to the one or more photodiodes;
      a passivation layer disposed proximate to the semiconductor layer over the pixel circuitry and the one or more photodiodes;
      a single contact etch stop layer disposed over the passivation layer, wherein the single contact etch stop layer defines one or more isolation regions, wherein there is an absence of material of the single contact etch stop layer in the one or more isolation regions defined in the single contact etch stop layer;
      one or more metal contacts coupled to the pixel circuitry through a first portion of the single contact etch stop layer, wherein a second portion of the single contact etch stop layer is disposed in a photodiode region of the one or more photodiodes,
      wherein the one or more isolation regions defined in the single contact etch stop layer isolate the first portion of the single contact etch stop layer from the second portion of the single contact etch stop layer;
    control circuitry coupled to the pixel array to control operation of the pixel array; and
    readout circuitry coupled to the pixel array to readout image data from the plurality of pixels.

12. The imaging system of claim 11 further comprising function logic coupled to the readout circuitry to store the image data readout from the image sensor pixels.

13. The imaging system of claim 11 wherein the one or more isolation regions defined in the single contact etch stop layer substantially eliminate stress paths in the single contact etch stop layer between the first portion of the single contact etch stop layer and the second portion of the single etch stop layer.

14. The imaging system of claim 11 wherein the one or more isolation regions are defined in the single contact etch stop layer where the material of the single contact etch stop layer is removed between the first portion of the single contact etch stop layer and the second portion of the single etch stop layer.

15. The imaging system of claim 11 wherein the one or more metal contacts comprise borderless contacts.

16. The imaging system of claim 11 wherein the single contact etch stop layer comprises nitride.

17. The imaging system of claim 11 wherein the single contact etch stop layer comprises silicon oxynitride.

18. The imaging system of claim 11 wherein the passivation layer comprises oxide.

19. The imaging system of claim 11 further comprising a dielectric layer disposed over the single contact etch stop layer.

20. The imaging system of claim 19 wherein the dielectric layer comprises borophosphosilicate glass.

21. The imaging system of claim 11 wherein the image sensor pixel is comprised in a complementary metal oxide semiconductor (CMOS) image sensor.

* * * * *